US008088670B2

(12) United States Patent
Akiyama et al.

(10) Patent No.: US 8,088,670 B2
(45) Date of Patent: Jan. 3, 2012

(54) METHOD FOR MANUFACTURING BONDED SUBSTRATE WITH SANDBLAST TREATMENT

(75) Inventors: Shoji Akiyama, Gunma (JP); Yoshihiro Kubota, Gunma (JP); Atsuo Ito, Gunma (JP); Kouichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/081,297

(22) Filed: Apr. 14, 2008

(65) Prior Publication Data
US 2008/0261381 A1    Oct. 23, 2008

(30) Foreign Application Priority Data

Apr. 18, 2007  (JP) ................................. 2007-109321
Feb. 29, 2008  (JP) ................................. 2008-050880

(51) Int. Cl.
*H01L 21/304*    (2006.01)
*H01L 21/30*     (2006.01)
*H01L 27/12*     (2006.01)
*H01L 21/18*     (2006.01)

(52) U.S. Cl. ........ 438/458; 438/455; 438/459; 438/471; 438/473; 438/474; 438/475; 438/476; 257/40; 257/E21.704; 257/E21.6

(58) Field of Classification Search .................. 438/413, 438/99, 780, 162, 311, 455–459, 471–479, 438/514, 515, 526, 795, 799, 974; 257/40, 257/E21.307, E21.6, E21.704
See application file for complete search history.

(56) References Cited

U.S. PATENT DOCUMENTS

| 4,068,018 A | * | 1/1978 | Hashimoto et al. ............... 430/5 |
| 4,312,012 A |   | 1/1982 | Frieser et al. |
| 5,629,132 A | * | 5/1997 | Suzuki et al. ................. 430/258 |
| 7,074,652 B2 |  | 7/2006 | Yoon et al. |

(Continued)

FOREIGN PATENT DOCUMENTS

CN         1416967 A      5/2003

(Continued)

OTHER PUBLICATIONS

Realize Co., UCS Semiconductor Substrate Technique Research Institute, "The Science of SOI", 2000, Chapter 2.

(Continued)

*Primary Examiner* — N Drew Richards
*Assistant Examiner* — John P Dulka
(74) *Attorney, Agent, or Firm* — Oliff & Berridge, PLC

(57) ABSTRACT

When manufacturing a bonded substrate using an insulator substrate as a handle wafer, there is provided a method for manufacturing a bonded substrate which can be readily removed after carried and after mounted by roughening a back surface of the bonded substrate (corresponding to a back surface of the insulator substrate) and additionally whose front surface can be easily identified like a process of a silicon semiconductor wafer in case of the bonded substrate using a transparent insulator substrate as a handle wafer. There is provided a method for manufacturing a bonded substrate in which an insulator substrate is used as a handle wafer and a donor wafer is bonded to a front surface of the insulator substrate, the method comprises at least that a sandblast treatment is performed with respect to a back surface of the insulator substrate.

24 Claims, 2 Drawing Sheets

U.S. PATENT DOCUMENTS

| | | | |
|---|---|---|---|
| 7,166,520 B1 * | 1/2007 | Henley | 438/458 |
| 2001/0042902 A1 * | 11/2001 | Wakabayashi et al. | 257/620 |
| 2005/0147743 A1 * | 7/2005 | Sekiya | 427/140 |
| 2005/0199995 A1 * | 9/2005 | Nomoto et al. | 257/692 |
| 2006/0094207 A1 * | 5/2006 | Yoo | 438/458 |
| 2006/0243620 A1 * | 11/2006 | Odashima et al. | 206/405 |

FOREIGN PATENT DOCUMENTS

| | | |
|---|---|---|
| EP | 0 791 953 A2 | 8/1997 |
| JP | 2006318984 A * | 11/2006 |
| JP | 2006324530 A * | 11/2006 |
| JP | A 2006-324530 | 11/2006 |

OTHER PUBLICATIONS

Chinese Office Action in Chinese Application No. 2008 10093348.4 mailed Mar. 8, 2011, with English-language translation.

European Search Report in European Application No. EP 08 00 7636, mailed Apr. 19, 2011.

* cited by examiner

FIG.2
(A) 
(B) 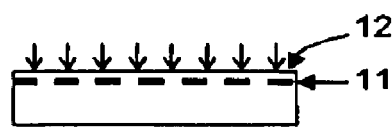
(C) 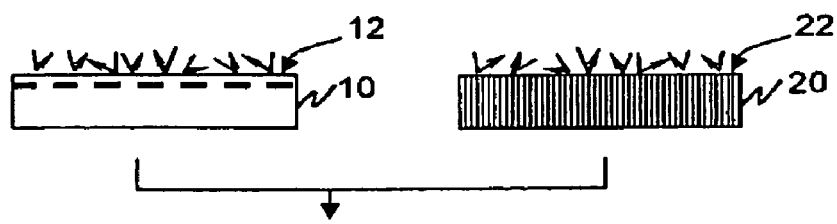
(D) 
(E) 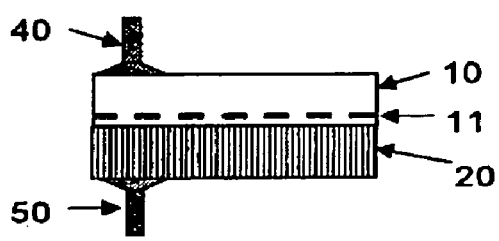
(F) MECHANICAL IMPACT
START OF DELAMINATION
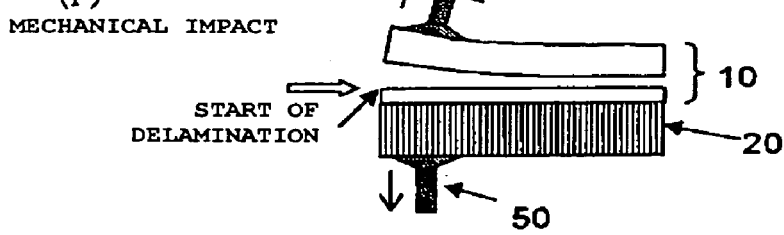
(G) 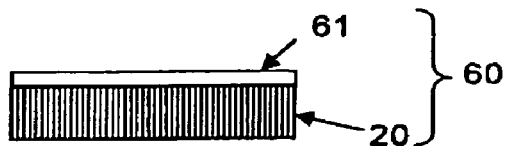

METHOD FOR MANUFACTURING BONDED SUBSTRATE WITH SANDBLAST TREATMENT

BACKGROUND OF THE INVENTION

1. Field of the Invention

The present invention relates to a method for manufacturing a bonded substrate, and more particularly to a method for manufacturing a bonded substrate having a silicon thin film formed on a front surface of an insulator substrate.

2. Description of the Related Art

To realize higher performances of a semiconductor device, a silicon-on-insulator (SOI) substrate has come under the spotlight in recent years. Further, a silicon-on-quartz (SOQ) substrate or a silicon-on-glass (SOG) substrate in which a support substrate (a handle wafer) is not formed of silicon is also expected to be applied to, e.g., a TFT-LCD, a radio-frequency (RF) device, or any other MEMS product.

There has been proposed a method for manufacturing, e.g., the SOQ substrate by using, e.g., a silicon substrate as a donor wafer whilst using a quartz substrate as a handle wafer and bonding these different kinds of substrates (see Japanese Patent Application Laid-open No. 2006-324530). In the thus fabricated bonded substrate, since the quartz substrate is usually fabricated by double-side polishing for simultaneously polishing a front surface and a back surface thereof, the back surface is also a mirror surface, there may occur problems in process/evaluation that are different from those of a regular SOI substrate manufactured by bonding silicon substrates.

As one of such problems, a wafer is appressed against a stage and hence becomes hard to be removed from the stage when carrying and fixing an SOQ substrate on an apparatus, or identifying a front surface and a back surface is difficult to provoke an erroneous operation in handling since a transparent substrate is adopted, for example.

SUMMARY OF THE INVENTION

In view of such a problem, it is an object of the present invention to provide a method for manufacturing a bonded wafer which can be readily removed after carried and after mounted by roughening a back surface of the bonded substrate (corresponding to a back surface of an insulator substrate) when manufacturing the bonded substrate using the insulator substrate as a handle wafer and additionally whose front surface can be readily identified like a process of a silicon semiconductor wafer in case of the bonded substrate using a transparent insulator substrate as a handle wafer.

To achieve this object, according to the present invention, there is provided a method for manufacturing a bonded substrate, which uses an insulator substrate as a handle wafer to manufacture a bonded substrate having a donor wafer bonded to a front surface of the insulator substrate, the method comprises at least that a sandblast treatment is performed with respect to a back surface of the insulator substrate.

In this manner, in the method for manufacturing the bonded substrate in which the insulator substrate is used as the handle wafer and the donor wafer is bonded to the front surface of the insulator substrate, performing the sandblast treatment with respect to the back surface of the insulator substrate enables roughening the back surface of the insulator substrate, and roughening the back surface can facilitate removal after carried and after mounted, and additionally the front surface can be easily identified in case of the bonded substrate using a transparent insulator substrate as the handle wafer like a process of a silicon semiconductor wafer.

Further, according to the present invention, there is provided a method for manufacturing a bonded substrate, which uses an insulator substrate as a handle wafer to manufacture a bonded substrate having a donor wafer bonded to a front surface of the insulator substrate, the method comprises that, a bonded substrate having a silicon thin film formed on the front surface of the insulator substrate is prepared, and then a sandblast treatment is performed with respect to a back surface of the bonded substrate.

When this method is adopted, roughening the back surface can facilitate removal after carried and after mounted. Furthermore, in case of the bonded substrate using a transparent insulator substrate as the handle wafer, a front surface can be easily identified like process of a silicon semiconductor wafer.

Moreover, according to the present invention, there is provided a method for manufacturing a bonded substrate in which a silicon thin film is formed on a front surface of an insulator substrate and a back surface side of the insulator substrate is roughened, the method comprises at least that, a bonded substrate having the silicon thin film formed on the front surface of the insulator substrate is prepared, a protective tape is put on at least the silicon thin film of the bonded substrate, and a sandblast treatment is performed with respect to the back surface of the insulator substrate.

In this manner, since the present invention includes putting the protective tape on at least the silicon thin film of the bonded substrate and then performing the sandblast treatment with respect to the back surface of the insulator substrate as a feature, roughening the back surface can facilitate removal after carried and after mounted. Additionally, in case of the bonded substrate using a transparent insulator substrate as a handle wafer, a front surface can be easily identified like a process of a silicon semiconductor wafer, and the protective tape can prevent a surface of the silicon thin film from being subjected to the sandblast treatment.

At this time, after the sandblast treatment is performed with respect to the back surface of the insulator substrate, the protective tape is removed, and the bonded substrate can be processed by using an aqueous solution containing a hydrofluoric acid.

Since the protective tape is removed after the sandblast treatment and the bonded substrate is processed by using the aqueous solution containing the hydrofluoric acid, particle generation from irregularities on the back surface subjected to the sandblast treatment can be effectively suppressed. Therefore, particle contamination can be suppressed from occurring.

Further, according to the present invention, there is provided a method for manufacturing a bonded substrate in which a silicon thin film is formed on a front surface of an insulator substrate and a back surface side of the insulator substrate is roughened, the method comprises at least that, a bonded substrate having the silicon thin film formed on the front surface of the insulator substrate is prepared, an organic film is formed on at least the silicon thin film of the bonded substrate, a sandblast treatment is performed with respect to the back surface of the insulator substrate, and then the bonded substrate is processed by using an aqueous solution containing a hydrofluoric acid, and subsequently the organic film is removed.

As explained above, the method for manufacturing the bonded substrate according to the present invention includes forming the organic film on at least the silicon thin film of the bonded substrate, performing the sandblast treatment with respect to the back surface of the insulator substrate, then processing the bonded substrate by using the aqueous solution containing the hydrofluoric acid, and subsequently removing the organic film as a feature. Therefore, the silicon thin film is covered with the organic film during processing using the aqueous solution containing the hydrofluoric acid, thereby preventing the aqueous solution containing the hydrofluoric acid from directly coming into contact with the silicon thin film.

Therefore, even if an HF defect is present in the bonded substrate, it is possible to avoid expansion of the defect caused when the hydrofluoric acid permeates from the surface side of the silicon thin film through the HF defect to etch the insulator substrate (e.g., a quartz substrate) present below the silicon thin film at the time of processing the bonded substrate by using the aqueous solution containing the hydrofluoric acid.

Furthermore, it is also possible to effectively prevent the hydrofluoric acid from permeating a space between the insulator substrate and the silicon thin film formed thereon and the silicon thin film from being delaminated.

Moreover, according to the present invention, there is provided a method for manufacturing a bonded substrate in which a silicon thin film is formed on a front surface of an insulator substrate and a back surface side of the insulator substrate is roughened, the method comprises at least that, a bonded substrate having the silicon thin film formed on the front surface of the insulator substrate is prepared, an organic film is formed on at least the silicon thin film of the bonded substrate, a protective tape is put on the organic film, a sandblast treatment is performed with respect to the back surface of the insulator substrate, then the protective tape is removed, and the bonded substrate is processed by using an aqueous solution containing a hydrofluoric acid, and subsequently the organic film is removed.

As explained above, in the method for manufacturing the bonded substrate according to the present invention, at least, the bonded substrate in which the silicon thin film is formed-on the front surface of the insulator substrate is first prepared, the organic film is formed on at least the silicon thin film of the bonded substrate, and the protective tape is put on the organic film. Therefore, the protective tape is put on the organic film, and it is not directly put to the silicon thin film.

Therefore, when the protective tape is removed after the sandblast treatment is performed with respect to the back surface of the insulator substrate, a damage, e.g., delamination due to the removal of the protective tape is prevented from being introduced into the surface of the silicon thin film.

Furthermore, since the bonded substrate is processed by using the aqueous solution containing the hydrofluoric acid and subsequently the organic film is removed, the silicon thin film is covered with the organic film during the processing using the aqueous solution containing the hydrofluoric acid, thereby very effectively preventing the aqueous solution containing the hydrofluoric acid from directly coming into contact with the silicon thin film, the HF defect from expanding, or the silicon thin film from being delaminated.

It is to be noted that the insulator substrate can be any one of a quartz substrate, a glass substrate, a sapphire substrate, and an alumina substrate.

The insulator substrate can be any one of the quartz substrate, the glass substrate, the sapphire substrate, and the alumina substrate in this manner, and the present invention is particularly preferable when fabricating an SOQ substrate, an SOG substrate, an SOS substrate, and an SOA (Silicon on Alumina) substrate.

Further, it is preferable that the organic film is formed by coating.

When the organic film is formed by coating in this manner, the organic film can be readily formed, which is simple.

At this time, the organic film can be a photoresist film.

When the organic film is the photoresist film, the organic film can be easily formed since a photoresist has been conventionally often used.

Furthermore, the organic film can be removed by a treatment using any one of ozone water, a sulfuric acid, a hot sulfuric acid, a sulfuric acid-hydrogen peroxide mixture, alcohol, and acetone, or by an oxygen plasma treatment or an ultraviolet treatment.

When removal of the organic film is performed by using any one of ozone water, a sulfuric acid, a hot sulfuric acid, a sulfuric acid-hydrogen peroxide mixture, alcohol, and acetone, or by an oxygen plasma treatment or an ultraviolet treatment in this manner, the organic film can be easily removed.

Moreover, the protective tape can be a dicing tape.

The dicing tape can be used as the protective tape in this manner, thereby sufficiently protecting the silicon thin film and others from the sandblast treatment.

Additionally, preparation of the bonded substrate comprises at least: implanting a hydrogen ion, a rare gas ion, or both of them into a silicon substrate or a silicon substrate having an oxide film formed on a surface thereof from the surface to form an ion implanted layer; closely bonding an ion implanted surface of the silicon substrate or the silicon substrate having the oxide film formed on the surface thereof to the front surface of the insulator substrate that is to be bonded to the ion implanted surface; and mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

Further, preparation of the bonded substrate comprises at least: implanting a hydrogen ion, a rare gas ion, or both of them into a silicon substrate or a silicon substrate having an oxide film formed on a surface thereof from the surface to form an ion implanted layer; performing a surface activation treatment with respect to at least one of an ion implanted surface of the silicon substrate or the silicon substrate having the oxide film formed on the surface thereof and the front surface of the insulator substrate that is to be bonded to the ion implanted surface; closely bonding the ion implanted surface of the silicon substrate or the silicon substrate having the oxide film formed on the surface thereof to the front surface of the insulator substrate; and mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

Here, when the insulator substrate having the roughened back surface is used at the time of mechanical delamination, a film thickness of the transferred silicon fluctuates since a stress at the time of mechanical delamination locally differs, which is not desirable. Specifically, when a stiffening plate is appressed against the back surface to control a delamination speed at the time of mechanical delamination, since a force of adhesion with respect to the stiffening plate locally differs, a stress at the time of mechanical delamination locally differs, and a film thickness of the transferred silicon fluctuates.

Adopting these methods enable preparing the bonded substrate which has the silicon thin film formed on the insulator substrate and is formed of different kinds of materials, and the bonded substrate is suitable for an application as a TFT-LCD, a radio-frequency (RF) device, and others.

Further, the surface of the silicon thin film can be subjected to mirror surface processing before and/or after the sandblast treatment.

The surface of the silicon thin film on which a device or the like is fabricated can be subjected to mirror surface processing before the sandblast treatment in this manner. In the present invention, the organic film and the protective tape enable a mirror surface state to be maintained even after sandblasting, and the surface of the silicon thin film can be of course subjected to the mirror surface processing after the sandblast treatment.

According to such a method for manufacturing the bonded substrate of the present invention, even the bonded substrate using the insulator substrate as the handle wafer can be easily removed after carried and after mounted by roughening the surface. Further, in case of the bonded substrate using the transparent insulator substrate as the handle wafer, the bonded substrate whose front surface can be easily identified can be manufactured like a process of a silicon semiconductor wafer.

BRIEF DESCRIPTION OF THE DRAWINGS

FIG. 2 is a process diagram showing an example of a procedure of bonding a silicon substrate and an insulator substrate.

DETAILED DESCRIPTION OF THE PREFERRED EMBODIMENTS

Figure 1:
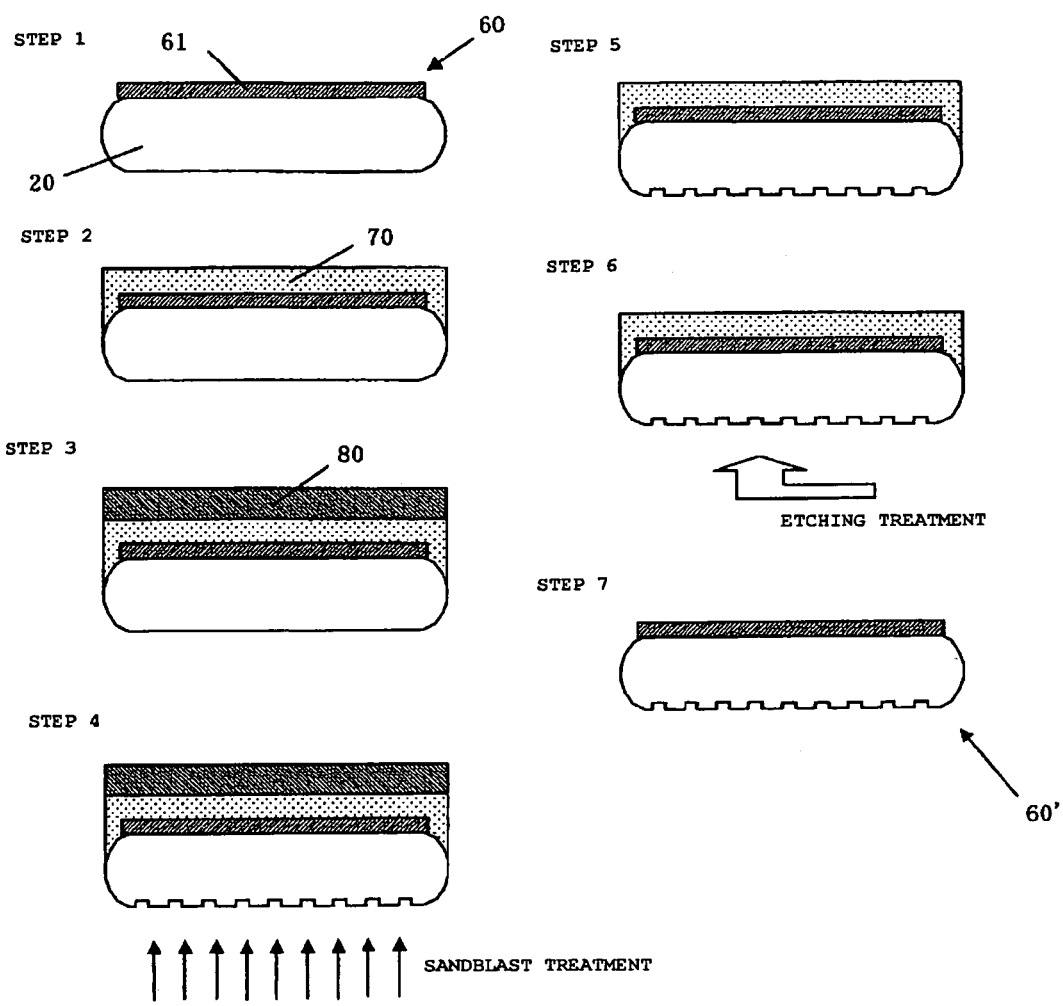
FIG. 1 is a process diagram showing an example of a process of a method for manufacturing a bonded substrate according to the present invention.

Although an embodiment of the present invention will now be explained hereinafter with reference to the drawings, the present invention is not restricted thereto.

FIG. 1 is a process diagram showing an example of a process of a method for manufacturing a bonded substrate according to the present invention.

Explaining an overall flow, a bonded substrate having a silicon thin film formed on a front surface of an insulator substrate is first prepared (Step 1). An organic film is formed on the silicon thin film with respect to the prepared bonded substrate (Step 2), and then a protective tape is further put thereon (Step 3). Thereafter, a sandblast treatment is carried out to roughen a back surface of the bonded substrate (Step 4), the protective tape is removed (Step 5), then the bonded substrate is processed by using an aqueous solution containing a hydrofluoric acid to etch a back surface thereof (Step 6), and the organic film is removed (Step 7), thereby obtaining the bonded substrate with the roughened back surface in which occurrence of, e.g., particle contamination is suppressed.

Each step will now be explained hereinafter in detail.
(Step 1)

First, a bonded substrate 60 having a silicon thin film 61 formed on a front surface of an insulator substrate 20 is prepared. That is, a silicon substrate is prepared as a donor wafer whilst the insulator substrate is prepared as a handle wafer, and these substrates are bonded to each other to fabricate the bonded substrate 60.

FIG. 2 shows an example of a procedure of fabricating this bonded substrate. As shown in FIG. 2(A), a silicon substrate 10 and the insulator substrate 20 are first prepared.

It is to be noted that a silicon substrate having an oxide film formed on a surface thereof can be used as the donor wafer in particular. It is to be noted that selecting such a material as the donor wafer enables manufacturing the bonded substrate having the silicon thin film.

Furthermore, as the insulator substrate 20 that is the handle wafer, a quartz substrate, any other glass substrate, a sapphire substrate, or an alumina substrate can be used, for example. Each of these materials is not restricted in particular as long as it is a transparent substrate having insulating properties. Such a material can be appropriately selected in accordance with, e.g., a purpose of a semiconductor device to be fabricated. Here, an example of using a quartz substrate will be explained.

Then, as shown in FIG. 2(B), a hydrogen ion is implanted from a surface (an ion implanted surface) 12 of the silicon substrate 10 to form an ion implanted layer 11.

Not only the hydrogen ion but also a rare gas ion or both the hydrogen ion and the rare gas ion may be ion-implanted in formation of this ion implanted layer 11. An implantation energy, an implantation dose, an implantation temperature, and any other ion implantation conditions can be appropriately selected so as to obtain a thin film having a predetermined thickness.

It is to be noted that, when a silicon substrate having an oxide film formed on a surface thereof is used to perform ion implantation through the oxide film, an effect of suppressing channeling of the implanted ion can be obtained, thereby further suppressing unevenness in implantation depth of the ion. As a result, a thin film having higher film thickness uniformity can be formed.

Subsequently, as shown in FIG. 2(C), a surface activation treatment is carried out with respect to the ion implanted surface 12 of the silicon substrate 10 and a bonding surface 22 of the insulator substrate 20. It is to be noted that the bonding surface 22 of the insulator substrate 20 means a surface that is bonded to the silicon substrate 10 based on the following procedure.

Of course, the surface activation treatment may be carried out with respect to only one of the ion implanted surface 12 of the silicon substrate 10 and the bonding surface 22 of the insulator substrate 20.

At this time, the surface activation treatment can be performed based on, e.g., an oxygen plasma treatment. A wafer subjected to cleaning, e.g., RCA cleaning is set in a vacuum chamber, a gas for plasma treatment (an oxygen gas) is introduced, and then the wafer is exposed to a radio-frequency plasma of approximately 100 W for 5 to 30 seconds to perform a plasma treatment with respect to a surface thereof.

It is to be noted that the gas for plasma treatment is not restricted to the oxygen gas, and a hydrogen gas, an argon gas, a mixed gas containing these gases, or a mixed gas containing the hydrogen gas and a helium gas can be also used. Further, a nitrogen gas of an inert gas can be used. Appropriately selecting a gas satisfying conditions can suffice.

The surfaces of the respective substrates 10 and 20 subjected to the surface activation treatment are activated so that OH groups are increased, for example. Therefore, when the ion implanted surface 12 of the silicon substrate is appressed against the bonding surface 22 of the insulator substrate in this state, the wafers can be further firmly bonded based on, e.g., hydrogen bonding.

It is to be noted that the following bonding step can be carried out without performing this surface activation treatment.

Subsequently, as shown in FIG. 2(D), the ion implanted surface 12 of the silicon substrate is appressed against the bonding surface 22 of the insulator substrate to bond these surfaces to each other.

When the surfaces subjected to the surface activation treatment are used as the bonding surfaces to contact the wafers closely to each other at a low pressure or a normal pressure and at a room temperature in this manner, both the wafers can be sufficiently firmly bonded to each other so that they can resist later mechanical delamination even if a high-temperature treatment is not performed.

It is to be noted that a heat treatment step for heating the wafers appressed against each other at 100 to 400° C. may be performed after the step for closely contacting the silicon substrate 10 and the insulator substrate 20.

When such a heat treatment is performed, bonding strength of the silicon substrate 10 and the insulator substrate 20 can be increased. In particular, when a heat treatment temperature is 100 to 300° C., a possibility that a thermal strain, a crack, delamination, and others due to a difference in coefficient of thermal expansion occur is low even if the substrates formed of different kinds of materials are bonded to each other. Increasing the bonding strength enables reducing occurrence of a failure at a delamination step.

Thereafter, as shown in FIG. 2(E), for example, a puller member 40 is appressed against the silicon substrate 10 to hold the silicon substrate 10, and also a puller member 50 holds the insulator substrate 20.

As the puller member, a member formed of one or more suction discs or a member that is formed of a porous material and adsorbed by each substrate 10 or 20 based on vacuum adsorption, and so on, can be used, but the puller member is not restricted thereto.

Subsequently, as shown in FIG. 2(F), an external impact is given from one end portion of the ion implanted layer 11 of the silicon substrate 10, the end portion is in a side where the puller member 40 is appressed, and also the puller members 40 and 50 are used to pull the silicon substrate 10 and the insulator substrate 20 to sequentially separate the silicon substrate 10 and the insulator substrate 20 at the ion implanted layer 11 from the one end portion having the external impact given thereto (a delamination start point) toward the other end portion, thereby thinning the silicon substrate 10.

In this manner, as shown in FIG. 2(G), a bonded substrate 60 having a silicon thin film 61 formed on the front surface of the insulator substrate 20 can be obtained.

(Step 2)

After preparing the bonded substrate 60 at the Step 1, as indicated by (STEP 2) in FIG. 1, an organic film 70 is formed on the silicon thin film 61.

Although a material and others of this organic film 70 are not restricted in particular, the organic film that can resist a hydrofluoric acid is desirable. For example, a photoresist is preferable. A following explanation will be given on the assumption that the organic film 70 is formed of a photoresist.

Further, here, it is more excellent to form the organic film 70 to surround the entire silicon thin film 61 so as to cover the silicon thin film 61.

In regard to these matters, when the bonded substrate 60 is processed by using an aqueous solution containing a hydrofluoric acid at a later Step 6, these matters prevent an HF defect present in the silicon thin film 61 from expanding or the silicon thin film 61 from being delaminated from the insulator substrate 20.

If the insulator substrate is, e.g., a quartz substrate, carrying out an etching step after the sandblast treatment without forming the organic film 70 causes the quartz substrate present below the silicon thin film to be etched to expand an HF defect when the HF defect is present in the silicon thin film and the hydrofluoric acid permeates from a surface of the silicon thin film through the defect. This results in a factor of, e.g., a device failure.

Furthermore, when the hydrofluoric acid permeates a space between the silicon thin film and the quartz substrate, a position of the quartz substrate where the hydrofluoric acid permeates is etched to delaminate the silicon thin film.

However, as indicated by (STEP 2) in FIG. 1, the organic film 70 that can resist the hydrofluoric acid is previously formed on the silicon thin film 61 so as to particularly cover the silicon thin film 61. Therefore, even if the bonded substrate 60 is etched at the later step 6, since the silicon thin film 61 is framed in by the organic film 70, it doesn't occur that the hydrofluoric acid permeates from the surface of the silicon thin film 61 through, e.g., an HF defect to etch the quartz substrate 20 below the silicon thin film 61 and hence the defect expands. Further, it doesn't occur that the hydrofluoric acid enters the space between the silicon thin film 61 and the quartz substrate 20 to etch the quartz substrate 20 and hence the silicon thin film 61 is delaminated.

It is to be noted that a formation method for the organic film 70 is not restricted in particular, but this film can be formed by, e.g., coating. Coating enables easily forming this film, which is preferable.

Moreover, when applying a photoresist, it is good to carry out an HMDS process as pre-processing. Performing the HMDS process enables increasing adhesion properties of a later-formed photoresist film and the silicon thin film 61.

Additionally, to increase the adhesion properties of these films, processing, e.g., soft baking can be performed after forming the photoresist film.

(Step 3)

Subsequently, a protective tape 80 is put on the organic film 70. When the protective tape 80 is put on the organic film 70 rather than being directly put on the silicon thin film 61, the surface of the silicon thin film 61 can be prevented from being removed together at the time of removing the protective tape 80, and hence the silicon thin film 61 is not damaged at a later step 5.

Further, as this protective tape 80, one that can prevent a side of the silicon thin film 61 of the bonded substrate 60 from being damaged when performing the sandblast treatment at the next Step 4 can suffice, and a material and others of this protective tape are not restricted in particular. For example, a dicing tape can be used.

(Step 4)

Regarding the bonded substrate 60 in which the organic film 70 is formed on the silicon thin film 61 formed on the front surface side of the insulator substrate 20 and on which furthermore the protective tape 80 is put in this manner, the back surface side (i.e., the back surface side of the insulator substrate 20) of the bonded surface 60 is subjected to the sandblast treatment to be intentionally roughened. As a result, the back surface side can be sensed by, e.g., a photodetector.

The sandblast treatment at this Step 4 is not restricted in particular, and it is carried out by using, e.g., the same apparatus as that in the conventional technology that applies particles of, e.g., alumina to the back surface side.

On the other hand, since the protective tape 80 is put on the front surface side (i.e., the side where the silicon thin film 61 is formed) of the bonded substrate 60, it is not damaged or roughened as different from the back surface side.

(Step 5)

After performing the sandblast treatment, the protective tape 80 is removed to prepare for an etching treatment using an aqueous solution containing a hydrofluoric acid at the next Step 6. It is to be noted that the protective tape 80 is put on the organic film 70 and it is not put on the silicon thin film 61. Therefore, when removing the protective tape 80 from the organic film 70, the surface of the silicon thin film 61 is not removed together with this tape, and the silicon thin film 61 is not damaged.

(Step 6)

Furthermore, the bonded substrate 60 is processed by using the aqueous solution containing the hydrofluoric acid at the step 6. That is, the back surface side (the back surface side of the insulator substrate 20) of the bonded substrate 60 subjected to the sandblast treatment is etched by using the aqueous solution containing the hydrofluoric acid. This method is not restricted in particular, and it can be performed by, e.g., immersing the bonded substrate 60 in the aqueous solution containing the hydrofluoric acid. Moreover, performing the etching treatment in this manner enables suppressing particles from being generated from the irregular surface roughened by the sandblast treatment.

At this time, as the aqueous solution used for the etching treatment, one containing the hydrofluoric acid can suffice so that the back surface side of the insulator substrate 20, e.g., a quartz substrate or a glass substrate can be etched, and it is not restricted in particular. For example, a hydrofluoric acid or a buffered hydrofluoric acid solution can be used, and a concentration and others of such a solution can be appropriately determined. For example, a solution that can appropriately perform etching to suppress generation of particles from irregularities formed by the sandblast treatment can be selected by repeating an experiment.

It is to be noted that the back surface side (the back surface side of the insulator substrate 20) of the bonded substrate 60 is etched and, on the other hand, the front surface side (the silicon thin film 61 side) of the same is covered with the organic film 70 that can resist the hydrofluoric acid. Therefore, the organic film 70 functions as a mask, and hence the aqueous solution containing the hydrofluoric acid does not directly come into contact with the surface of the silicon thin film 61. Therefore, even if an HF defect is present in the silicon thin film 61, it is possible to effectively avoid expansion of the defect, which occurs when the hydrofluoric acid permeates the insulator substrate 20 from the surface side of the silicon thin film 61 through the HF defect to etch the insulator substrate 20, e.g., a quartz substrate.

Additionally, as indicated by (Step 2) in FIG. 1, when the organic film 70 is formed so as to cover a bonding boundary (bonding surfaces) of the silicon thin film 61 and the insulator substrate 20, the aqueous solution containing the hydrofluoric acid does not directly come into contact with this bonding boundary portion. Therefore, It can be prevented that the hydrofluoric acid permeates from this bonding boundary portion to etch the insulator substrate 20 and the silicon film 61 is delaminated from the insulator substrate 20.

(Step 7)

Thereafter, the organic film 70 serving as a mask in the etching treatment at the step 6 is removed. Although this removal method is not restricted in particular, the organic film 70 can be removed by using, e.g., ozone water, a sulfuric acid, a hot sulfuric acid, a sulfuric acid-hydrogen peroxide mixture, alcohol, or acetone. Furthermore, as another method, an oxygen plasma treatment or an ultraviolet treatment (an UV treatment) may be used to remove the organic film 70. A method that can remove the organic film 70 formed on the silicon thin film 61 without giving, e.g., a damage to the silicon thin film 61 can suffice, and it can be appropriately determined based on a material and others of the organic film 70.

Performing at least the Steps 1 to 7 enables obtaining a bonded substrate 60' having a structure where the silicon thin film 61 is formed on the front surface of the insulator substrate 20 and the back surface side of the insulator substrate 20 is roughened. In this bonded substrate 60', the silicon thin film 61 has no damage or is not delaminated from the insulator substrate 20, and an HF defect does not expand in the manufacturing process even if the defect is present. Additionally, the back surface side of the insulator substrate 20 is appropriately roughened and, on the other hand, particle generation can be effectively suppressed, thereby preventing occurrence of, e.g., particle contamination at later steps.

It is to be noted that the manufacturing method using the Steps 1 to 7 has been explained as the method for manufacturing the bonded substrate according to the present invention as shown in FIG. 1, but the present invention is not of course restricted thereto, and other steps can be added as required. For example, after the Step 5 for removing the protective tape 80, cleaning using, e.g., water or ultrasonic water can be performed and then the etching treatment using the aqueous solution containing the hydrofluoric acid at the Step 6 can be carried out.

Furthermore, the surface of the silicon thin film 61 on which a device is fabricated may be subjected mirror surface processing at any timing before the Step 4 of performing the sandblast treatment. Even if the mirror surface processing is performed before the sandblast treatment in this manner, the mirror finished surface of the silicon thin film 61 is not damaged during the sandblast treatment since the silicon thin film 61 is protected by the protective tape 80 through the organic film 70. And the surface of the silicon thin film 61 is not removed when removing the protective tape 80 after sandblast treatment because the protective tape 80 is not directly put on the silicon thin film 61, thereby sufficiently maintaining the mirror surface state.

Of course, the surface of the silicon thin film 61 may be again subjected to mirror surface processing after the sandblast treatment, or mirror surface processing may be performed only after the sandblast treatment. A timing of this processing can be appropriately determined while considering a cost, a labor hour, a time required for an operation, and others.

Further, as one of other embodiments of the present invention, there is also a method, which includes forming the organic film 70 on the silicon thin film 61 without using the protective tape 80, performing the sandblast treatment with respect to the back surface of the insulator substrate 20, and then performing the etching treatment using the hydrofluoric acid, and thereafter removing the organic film 70. That is, this is a method performing the steps 1, 2, 4, 6, and 7 depicted in FIG. 1. According to this method, an aqueous solution containing the hydrofluoric acid does not of course directly come into contact with the silicon thin film 61, and expansion of an HF defect or delamination of the silicon thin film 61 can be avoided.

In this case, as the organic film 70, one having resistance properties or an adjusted thickness so that it can function as the protective tape in the sandblast treatment is preferable.

Moreover, as still another embodiment, the protective tape 80 can be put on the front surface side (the surface of the silicon thin film) of the bonded substrate without forming the organic film 70, and the back surface of the same can be subjected to the sandblast treatment. According to this method, the protective tape 80 can of course effectively prevent the surface of the silicon thin film from being damaged at the time of the sandblast treatment.

In this case, as the protective tape 80, it is preferable to select an appropriate one while considering adherence and others so that the surface of the silicon thin film can be hardly delaminated when removing the protective tape 80 from the surface of the silicon thin film at a later step.

Moreover, after removing the protective tape 80, processing using an aqueous solution containing a hydrofluoric acid can be performed as required in order to suppress particle generation from irregularities on the back surface.

Additionally, as an easier method, there is also a bonded substrate method of manufacturing subjecting the back surface of the insulator substrate 20 to the sandblast treatment alone. Such a sandblast treatment is performed with respect to the back surface of the insulator substrate 20 as a handle wafer in the first place, thereby the back surface is roughened, and therefore the bonded substrate can be readily removed after carried and after mounted. And additionally, the bonded substrate whose front surface can be easily identified can be obtained like a process of a silicon semiconductor wafer in case of the bonded substrate having a transparent insulator substrate as a handle wafer.

EXAMPLES

The method for manufacturing a bonded substrate according to the present invention will now be more specifically explained based on an example or a comparative example.

Example 1

The method for manufacturing a bonded substrate according to the present invention is carried out to manufacture a bonded substrate having a roughened back surface side.

A silicon substrate having a diameter of 150 mm was prepared as a donor wafer, and a silicon oxide film having a thickness of 100 nm was formed on a front surface of this substrate by thermal oxidation. A hydrogen ion was implanted into this substrate through the silicon oxide film to form an ion implanted layer. As ion implantation conditions, an implantation energy is 35 keV, an implantation dose is $9 \times 10^{16}/cm^2$, and an implantation depth is 0.3 nm.

Further, a quartz substrate having a diameter of 150 mm was prepared as a handle wafer.

Subsequently, a plasma treatment apparatus was used to introduce a nitrogen gas as a gas for plasma treatment, and a surface activation treatment was performed with respect to an ion implanted surface of the prepared silicon substrate and a front surface of the quartz substrate.

Further, these substrates were bonded at a room temperature and subjected to a heat treatment at 300° C. for 30 minutes, and then puller members were used to partially delaminated the silicon substrate while using the ion implanted layer as a boundary, thereby fabricating a bonded substrate having a silicon thin film formed on the front surface of the quartz substrate. This is determined as a sample wafer.

A photoresist was applied to a surface of the silicon thin film side of this sample wafer so as to cover the entire silicon thin film, and this wafer was dried and then subjected to soft baking.

Further, a dicing tape as a protective tape was put on a photoresist film, and a sandblast treatment was performed with respect to a back surface side of the sample wafer. Particles of alumina were used in the sandblast treatment.

After the sandblast treatment, the dicing tape was removed from the photoresist film, and cleaning using ultrasonic water was carried out. Furthermore, the back surface side of the sample wafer (the back surface side of the quartz substrate) subjected to the sandblast treatment was etched by immersing the sample wafer in a hydrofluoric acid solution without removing the photoresist film.

Then, the photoresist film was removed by using acetone, thus manufacturing a bonded substrate having a roughened back surface side.

A photodetector was able to detect the back surface of the bonded substrate manufactured in this manner by the manufacturing method according to the present invention. Moreover, evaluating states of the front and back surfaces, particles were not observed on the back surface side subjected to the sandblast treatment, delamination of the silicon thin film was not observed on the front surface side, and therefore it was revealed that the high-quality bonded substrate was obtained.

Example 2

The same sample wafer as that in Example 1 was prepared.

A dicing tape as a protective tape was directly put on a surface of a silicon thin film side of this sample wafer, and a sandblast treatment was performed with respect to a back surface side of the sample wafer like Example 1.

After the sandblast treatment, the dicing tape was removed from a silicon thin film, and cleaning using ultrasonic water was performed. Moreover, the back surface side of the sample wafer (a back surface side of a quartz substrate) subjected to the sandblast treatment was etched by immersing the sample wafer in a hydrofluoric acid solution, thereby manufacturing a bonded substrate having a roughened back surface side.

Evaluating states of front and back surfaces of the bonded substrate-manufactured in this manner by the manufacturing method according to the present invention, delamination of a silicon thin film from the quartz substrate or delamination in a surface of the silicon thin film was partially confirmed. However, the bonded substrate can be readily removed after carried and after mounted by surface roughening, and additionally in case of the bonded substrate having a transparent insulator substrate as a handle wafer, the bonded substrate whose front surface can be readily identified was obtained like a process of a silicon semiconductor wafer.

It is to be noted that the present invention is not restricted to the foregoing embodiments. The foregoing embodiments are just examples, and any examples, which have substantially the same structure and demonstrate the same functions and effects, as those in the technical concept explained in claims of the present invention are included in the technical scope of the present invention.

For instance, although the quartz substrate is used as the insulator substrate in the above examples, any other transparent glass substrate can be used as the insulator substrate.

What is claimed is:

1. A method for manufacturing a bonded substrate in which a silicon thin film is formed on a front surface of an insulator substrate and a back surface side of the insulator substrate is roughened, the method comprises at least that, a bonded substrate having the silicon thin film formed on the front surface of the insulator substrate is prepared, an organic film is formed on at least the silicon thin film of the bonded substrate, a sandblast treatment is performed with respect to the back surface of the insulator substrate (a) to remove an entirety of the bonded substrate after the bonded substrate is carried and mounted, and (b) to identify the front surface of the bonded substrate, and then the bonded substrate is processed by using an aqueous solution containing a hydrofluoric acid, and subsequently the organic film is removed.

2. The method for manufacturing a bonded substrate according to claim 1, wherein the insulator substrate is any one of a quartz substrate, a glass substrate, a sapphire substrate, and an alumina substrate.

3. The method for manufacturing a bonded substrate according to claim 1, wherein the organic film is formed by coating.

4. The method for manufacturing a bonded substrate according to claim 1, wherein the organic film is a photoresist film.

5. The method for manufacturing a bonded substrate according to claim 1, wherein the organic film is removed by a treatment using any one of ozone water, a sulfuric acid, a hot sulfuric acid, a sulfuric acid-hydrogen peroxide mixture, alcohol, and acetone, or by an oxygen plasma treatment or an ultraviolet treatment.

6. The method for manufacturing a bonded substrate according to claim 1, wherein preparation of the bonded substrate comprises at least:
implanting a hydrogen ion, a rare gas ion, or both of them into a silicon substrate or a silicon substrate having an oxide film formed on a surface thereof from the surface to form an ion implanted layer;
closely bonding an ion implanted surface of the silicon substrate or the silicon substrate having the oxide film formed on the surface thereof to the front surface of the insulator substrate that is to be bonded to the ion implanted surface; and
mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

7. The method for manufacturing a bonded substrate according to claim 1, wherein preparation of the bonded substrate comprises at least:
implanting a hydrogen ion, a rare gas ion, or both of them into a silicon substrate or a silicon substrate having an oxide film formed on a surface thereof from the surface to form an ion implanted layer;
performing a surface activation treatment with respect to at least one of an ion implanted surface of the silicon substrate or the silicon substrate having the oxide film formed on the surface thereof and the front surface of the insulator substrate that is to be bonded to the ion implanted surface;
closely bonding the ion implanted surface of the silicon substrate or the silicon substrate having the oxide film formed on the surface thereof to the front surface of the insulator substrate; and
mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

8. The method for manufacturing a bonded substrate according to claim 1, wherein a surface of the silicon thin film is subjected to mirror surface processing before and/or after the sandblast treatment.

9. A method for manufacturing a bonded substrate in which a silicon thin film is formed on a front surface of an insulator substrate and a back surface side of the insulator substrate is roughened, the method comprises at least that, a bonded substrate having the silicon thin film formed on the front surface of the insulator substrate is prepared, an organic film is formed on at least the silicon thin film of the bonded substrate, a protective tape is put on the organic film, a sandblast treatment is performed with respect to the back surface of the insulator substrate (a) to remove an entirety of the bonded substrate after the bonded substrate is carried and mounted, and (b) to identify the front surface of the bonded substrate, then the protective tape is removed, and the bonded substrate is processed by using an aqueous solution containing a hydrofluoric acid, and subsequently the organic film is removed.

10. The method for manufacturing a bonded substrate according to claim 9, wherein the insulator substrate is any one of a quartz substrate, a glass substrate, a sapphire substrate, and an alumina substrate.

11. The method for manufacturing a bonded substrate according to claim 9, wherein the organic film is formed by coating.

12. The method for manufacturing a bonded substrate according to claim 9, wherein the organic film is a photoresist film.

13. The method for manufacturing a bonded substrate according to claim 9, wherein the organic film is removed by a treatment using any one of ozone water, a sulfuric acid, a hot sulfuric acid, a sulfuric acid-hydrogen peroxide mixture, alcohol, and acetone, or by an oxygen plasma treatment or an ultraviolet treatment.

14. The method for manufacturing a bonded substrate according to claim 9, wherein preparation of the bonded substrate comprises at least:
implanting a hydrogen ion, a rare gas ion, or both of them into a silicon substrate or a silicon substrate having an oxide film formed on a surface thereof from the surface to form an ion implanted layer;
closely bonding an ion implanted surface of the silicon substrate or the silicon substrate having the oxide film formed on the surface thereof to the front surface of the insulator substrate that is to be bonded to the ion implanted surface; and
mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

15. The method for manufacturing a bonded substrate according to claim 9, wherein preparation of the bonded substrate comprises at least:
implanting a hydrogen ion, a rare gas ion, or both of them into a silicon substrate or a silicon substrate having an oxide film formed on a surface thereof from the surface to form an ion implanted layer;
performing a surface activation treatment with respect to at least one of an ion implanted surface of the silicon substrate or the silicon substrate having the oxide film formed on the surface thereof and the front surface of the insulator substrate that is to be bonded to the ion implanted surface;
closely bonding the ion implanted surface of the silicon substrate or the silicon substrate having the oxide film formed on the surface thereof to the front surface of the insulator substrate; and
mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

16. The method for manufacturing a bonded substrate according to claim 9, wherein a surface of the silicon thin film is subjected to mirror surface processing before and/or after the sandblast treatment.

17. The method for manufacturing a bonded substrate according to claim 9, wherein the protective tape is a dicing tape.

18. The method for manufacturing a bonded substrate according to claim 17, wherein the insulator substrate is any one of a quartz substrate, a glass substrate, a sapphire substrate, and an alumina substrate.

19. The method for manufacturing a bonded substrate according to claim 18, wherein the organic film is formed by coating.

20. The method for manufacturing a bonded substrate according to claim 19, wherein the organic film is a photoresist film.

21. The method for manufacturing a bonded substrate according to claim 20, wherein the organic film is removed by a treatment using any one of ozone water, a sulfuric acid, a hot sulfuric acid, a sulfuric acid-hydrogen peroxide mixture, alcohol, and acetone, or by an oxygen plasma treatment or an ultraviolet treatment.

22. The method for manufacturing a bonded substrate according to claim 21, wherein preparation of the bonded substrate comprises at least:
  implanting a hydrogen ion, a rare gas ion, or both of them into a silicon substrate or a silicon substrate having an oxide film formed on a surface thereof from the surface to form an ion implanted layer;
  closely bonding an ion implanted surface of the silicon substrate or the silicon substrate having the oxide film formed on the surface thereof to the front surface of the insulator substrate that is to be bonded to the ion implanted surface; and
  mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

23. The method for manufacturing a bonded substrate according to claim 21, wherein preparation of the bonded substrate comprises at least:
  implanting a hydrogen ion, a rare gas ion, or both of them into a silicon substrate or a silicon substrate having an oxide film formed on a surface thereof from the surface to form an ion implanted layer;
  performing a surface activation treatment with respect to at least one of an ion implanted surface of the silicon substrate or the silicon substrate having the oxide film formed on the surface thereof and the front surface of the insulator substrate that is to be bonded to the ion implanted surface;
  closely bonding the ion implanted surface of the silicon substrate or the silicon substrate having the oxide film formed on the surface thereof to the front surface of the insulator substrate; and
  mechanically delaminating the silicon substrate or the silicon substrate having the oxide film formed on the surface thereof at the ion implanted layer as a boundary to thin the silicon substrate or the silicon substrate having the oxide film on the surface thereof and to form the silicon thin film on the front surface of the insulator substrate, thereby preparing the bonded substrate.

24. The method for manufacturing a bonded substrate according to claim 23, wherein a surface of the silicon thin film is subjected to mirror surface processing before and/or after the sandblast treatment.

* * * * *